United States Patent
Okamoto et al.

(10) Patent No.: US 6,171,641 B1
(45) Date of Patent: Jan. 9, 2001

(54) VACUUM PROCESSING APPARATUS, AND A FILM DEPOSITION APPARATUS AND A FILM DEPOSITION METHOD BOTH USING THE VACUUM PROCESSING APPARATUS

(75) Inventors: Akira Okamoto, Chigasaki; Shigeru Kobayashi, Hiratsuka; Hideaki Shimamura, Yokohama; Susumu Tsuzuku, Tokyo; Eisuke Nishitani, Yokohama; Satosi Kisimoto, Yokohama; Yuji Yoneoka, Yokohama, all of (JP)

(73) Assignee: Hitachi, Ltd., Tokyo (JP)

( * ) Notice: Under 35 U.S.C. 154(b), the term of this patent shall be extended for 0 days.

(21) Appl. No.: 08/260,321

(22) Filed: Jun. 15, 1994

Related U.S. Application Data

(63) Continuation of application No. 07/741,526, filed on Aug. 12, 1991, now abandoned.

(30) Foreign Application Priority Data

Dec. 11, 1989 (JP) .................................................. 1-318749
Aug. 29, 1990 (JP) .................................................. 2-225388
Dec. 10, 1990 (WO) ..................................... PCT/JP90/01601

(51) Int. Cl.$^7$ .............................. C23C 16/46; C23C 14/54
(52) U.S. Cl. ..................... 427/8; 427/248.1; 204/192.13; 204/192.33; 374/130
(58) Field of Search ................... 427/248.1, 8; 156/627; 204/192.13, 192.33, 298.03, 298.09; 374/130

(56) References Cited

U.S. PATENT DOCUMENTS

| | | |
|---|---|---|
| 4,810,342 | 3/1989 | Inoue . |
| 4,890,245 | 12/1989 | Yomoto et al. . |
| 4,956,538 | 9/1990 | Moslehi . |
| 4,979,134 | 12/1990 | Arima et al. . |
| 4,984,902 | 1/1991 | Crowley et al. . |
| 5,114,242 | 5/1992 | Gat et al. . |
| 5,147,498 | * 9/1992 | Nashimoto .......................... 156/627 |
| 5,155,337 | 10/1992 | Sorrell et al. . |
| 5,180,226 | 1/1993 | Moslehi . |
| 5,271,084 | 12/1993 | Vandenabeele et al. . |

FOREIGN PATENT DOCUMENTS

| | | |
|---|---|---|
| 58-48915 | 3/1983 | (JP) . |
| 1-129966 | 5/1989 | (JP) . |
| 4-62011 | 2/1992 | (JP) . |
| 4-65329 | 3/1992 | (JP) . |

* cited by examiner

*Primary Examiner*—Timothy Meeks
(74) *Attorney, Agent, or Firm*—Antonelli, Terry, Stout & Krauss, LLP

(57) ABSTRACT

A vacuum processing apparatus for performing various processes on a wafer in a vacuum chamber, and a film deposition method and a film deposition apparatus using this vacuum processing apparatus. The vacuum processing apparatus, the film deposition method and the film deposition apparatus using the vacuum processing apparatus according to this invention are characterized in that temperature control of the wafer is performed in a film deposition process, and particularly characterized in that after the emissivity calibration using a combination of a temperature calibration stage and a shutter is performed, the substrate is transferred to stages in a vacuum film deposition process chamber, and a film is deposited on the substrate by controlling the substrate temperature to a specified temperature.

5 Claims, 10 Drawing Sheets

(a) A SHUTTER NOT PROVIDED (b) A SHUTTER PROVIDED

HEAT TRANSFER GAS

HEAT TRANSFER GAS

VACUUM PROCESSING APPARATUS, AND A FILM DEPOSITION APPARATUS AND A FILM DEPOSITION METHOD BOTH USING THE VACUUM PROCESSING APPARATUS

CROSS-REFERENCE TO RELATED APPLICATIONS

This application is a continuation application of U.S. application Ser. No. 07/741,526, filed Aug. 12, 1991, now abandoned, and is related to U.S. application Ser. No. 08/437,683, filed May 9, 1995, now U.S. Pat. No. 5,815,396 which is a continuation application of U.S. application Ser. No. 08/018,390, filed Feb. 17, 1994, now abandoned, which is a continuation-in-part application of U.S. application Ser. No. 07/741,526 now abandoned

TECHNICAL FIELD

This invention relates to a vacuum processing apparatus for performing various processes on a substrate in a vacuum, and a film deposition apparatus and a film deposition method both using the vacuum processing apparatus, and more particularly to a vacuum processing apparatus suitable for use in the fabrication process of semiconductor devices, and a film deposition apparatus and a film deposition method using the vacuum processing apparatus.

BACKGROUND ART

In process equipment used for the fabrication of semiconductor devices, accurate control of process temperature is important for well-controlled reactions and/or film growth to be accomplished. Representative of a kind of the process equipment in which temperature is the most important setting condition are the so-called furnace bodies of the oxidation furnace or the like. The furnace bodies of this kind are filled with an oxidizing atmosphere in place of the atmospheric air. The substitution atmosphere in this case is at atmospheric pressure or higher. In the furnace, a silicon wafer, for example, is heated by radiation of a heater installed around a quartz tube and also by heat transfer by the atmosphere at ambient pressure in the quartz tube. To be more specific, since there is a heat transfer medium, the temperature can be measured relatively accurately with a measuring element such as a thermocouple located in the heat transfer atmosphere.

To give an example in which a heat transfer medium is not used, still, in which the temperature is well controlled, it is the baking apparatus for photoresist used in the process step of applying a photoresist as the mask in the etching process. In this baking apparatus, photoresist is baked in the atmosphere at atmospheric temperature. The silicon wafer is placed on a heat block with a heat capacity greater than that of the silicon wafer heated to a specified baking temperature. Then, the silicon wafer is pressed with its whole surface against the heat block side by the atmospheric pressure by the use of a vacuum chuck. The temperature of the wafer comes to be in equilibrium with the temperature of the heat block, so that the wafer temperature can be controlled accurately by a temperature measuring element such as a thermocouple mounted on the heat block.

Most of the semiconductor device manufacturing processes utilize well-controlled reactions in a dust-free environment, and therefore, often require processing in a vacuum. Hitherto, it has been fundamentally difficult to implement precise temperature control of the wafer in a vacuum in the manufacturing of semiconductor devices. The reasons are as follows.

In heating the wafer with a lamp heater, due to the absence of a heat transfer medium, the wafer is heated only by radiation. Therefore, as is well known, a very small amount of heat is absorbed by the mirror-like surface of a metal due to its high reflectance, while a large amount of heat is absorbed by a black body. Accordingly, the degree of heat absorption differs greatly with the surface condition of a wafer to be heated.

By using a thermocouple attached to a wafer, an attempt has been made to accurately measure the temperature of the wafer during processing. In this case, however, the wafer temperature is measured with a thermocouple in point contact with the wafer, and this contact condition of the thermocouple is difficult to maintain stably. The result is a poor reproducibility of the measured temperature.

When a silicon wafer is heated by infrared radiation, due to the fact that silicon wafer is substantially transparent in a wide area of the infrared region, not only the heat travels to the thermocouple by heat transfer from the wafer but the thermocouple is directly heated by the lamp heater. This makes it difficult to accurately measure the wafer temperature.

Also, there is a method of forcibly bringing a heat transfer medium into a vacuum. For example, as disclosed in JP-A-56-48132 or JP-A-58-213434, a silicon wafer is clamped to a heat block located in a vacuum, a gas is filled between the backside of the silicon wafer and the heat block with a pressure of about 1 Torr, thereby making the wafer temperature to be in equilibrium with the heat block temperature. Also in this case, the equilibrium wafer temperature to the heat block is measured by a temperature measuring element such as a thermocouple mounted to the heat block.

In this example, however, the uniformity and reproducibility of temperature may not be sufficient because the wafer is clamped to the heat block by a small force compared with a case where a vacuum chuck is used under atmospheric pressure. The greatest disadvantage of this heating method is that due to the low density of the heat transfer medium, it takes time for the heat be conducted from the heat block to the wafer. Even if a thermal equilibrium is reached the heat block and the wafer eventually, as described with reference to the above example, it takes several to several tens of second, and various factors are considered to affect the reproducibility of the heat transfer time. If the damper fails to clamp the wafer properly, the wafer temperature dose not reach the equilibrium, and, hence, accuracte temperature can be known by no means.

As has been described, whichever heating means is used, it is necessary to measure the wafer temperature with no contact with the wafer in a vacuum. As one method of this type, a method has been proposed which measures the radiation intensity from the wafer in the infrared region by using an infrared thermometer.

Specifically, this method is to mount a wafer on the heat stage in a sputter-deposition apparatus and, while heating, to measure the wafer temperature with an infrared thermometer through a hole in a target placed against the wafer. To be more concrete, the infrared emissivity of the wafer at specific temperatures is measured in advance using a calibration specimen, and according to the measured values, the wafer temperature is controlled during sputtering.

An example related to this technique is revealed in JP-A-1-129966.

In this method, however, the emissivity of the wafer is not necessarily constant as described below, so that it is difficult to implement an accurate temperature measurement and there are some problems.

To be more specific, as a specimen for calibration, a silicon wafer is used to which is deposited with several hundreds of Å of aluminum, for example. The infrared emissivity observed by an infrared thermometer from the wafer surface differs with the presence or absence of a metal on the front side of the wafer, making it impossible to control temperature without knowing the emissivities before and after film deposition.

After film deposition is started, accurate temperature measurement cannot be performed until a film has been deposited to a certain degree of thickness (500 to 1000 Å of aluminum, for example).

When a metal film is desposited, a mirror-like surface is formed, which reduces the emissivity to a very small value, thus making measurement very difficult.

There is a problem which makes it difficult to perform an accurate wafer temperature measurement in a vacuum and temperature control that goes with it. The problem is that the infrared emissivity differs with different lots of wafers. If the method is used in which another wafer for calibration is prepared as in the above example, accurate temperature control of wafers cannot be implemented because the wafer for calibration is different from wafers on which a film is actually deposited, accurate wafer temperature control cannot be performed.

In the vacuum processing apparatuses which have been heretofore used, various temperature control means have been used, but there has been no apparatus capable of controlling the wafer temperature by accurately knowing the in-process temperature.

An ideal method of wafer temperature control using a infrared thermometer is to calibrate the infrared thermometer using a wafer on which a film is actually deposited and to thereby make it possible to measure the wafer temperature regardless of the presence or absence of a deposited film and the difference in the infrared emissivity resulting from the film condition. However, no method applicable to practical use has been proposed.

SUMMARY OF THE INVENTION

Therefore, this invention is aimed at solving the above problems. A first object of this invention is to provide an improved vacuum processing apparatus capable of accurately measuring and controlling the temperature of a substrate in a vacuum. A second object is to provide a film deposition apparatus, a sputter-deposition apparatus or a CVD (Chemical Vapor Deposition) apparatus, for example, in which the vacuum processing is performed. A third object is to provide a film deposition method by the improved film deposition apparatus. A fourth object is to provide a measuring method of the temperature of a substrate.

Means for achieving the above objects will be described in the concrete. The first object is achieved by (1) a vacuum processing apparatus comprising:
first infrared radiation thermometer for measuring a heat radiation of a substrate on a temperature calibration stage including means for heating or cooling the substrate on the stage to a known setting temperature;
means for obtaining an emissivity from output of the first infrared radiation thermometer according to a known temperature of the substrate, and computing an infrared sensitivity correction value to correctly display the temperature of the substrate by the first infrared radiation thermometer;
a vacuum processing chamber comprising a stage for holding the substrate discharged from the temperature calibration stage, means for heating or cooling the substrate to a specified setting temperature, and means for vacuum processing of the substrate;
a second infrared radiation thermometer for measuring the radiation of the substrate on the stage in the vacuum processing chamber; and
means for computing a true temperature of the substrate placed in the vacuum processing chamber from the second infrared radiation thermometer according to the infrared sensitivity correction value obtained at the temperature calibration stage.

Preferably, the first object is achieved by
(2) a vacuum processing apparatus comprising:
a temperature calibration chamber including means for heating or cooling a substrate held on a stage to a known setting temperature;
a first infrared radiation thermometer for measuring the radiation heat of the substrate on the temperature calibration stage;
means for obtaining an emissivity from output of the first infrared radiation thermometer according to the known temperature of the substrate, and computing an infrared sensitivity correction value to correctly display the temperature of the substrate by the first infrared radiation temperature;
a vacuum processing chamber comprising means for heating or cooling the substrate to a specified setting temperature and means for vacuum processing of the substrate;
a second infrared radiation thermometer for measuring the radiation heat of the substrate on the stage in the vacuum processing chamber;
means for computing a true temperature of the substrate placed in the vacuum processing chamber from output of the second infrared radiation thermometer according to the infrared sensitivity correction value obtained by the temperature calibration chamber;
temperature control means for adjusting the amount of the substrate temperature deviation, judged according to the substrate temperature obtained from output of the second infrared radiation thermometer, from the specified setting temperature in the vacuum processing chamber; and
a shutter mechanism which is disposed above and close to the substrate front surface in one or each of the chambers and the main face of which is formed by a member sufficiently mirror-like with respect to measuring wavelengths of the infrared thermometer.

The first object is also achieved by
(3) a vacuum processing apparatus according to (1) or (2) above, wherein each of the above-mentioned stages is provided with substrate temperature control means including an observation hole for observing the substrate temperature with the infrared radiation thermometer, a light path for introducing an infrared light from the substrate to the infrared radiation thermometer, gas introducing means, provided in the surface of the stage in contact with the substrate, for filling a space between the substrate and the stage with a specified gas under a specified gas pressure, and a movable light-path-closing shutter capable of closing the observation hole.

The first object is also achieved by
(4) a vacuum processing apparatus according to (1) or (2) above, wherein each of the above-mentioned stages is provided with substrate temperature control means including an observation hole for observing the substrate temperature with the infrared radiation thermometer, a light path for introducing an infrared light from the substrate to the infrared radiation thermometer, gas introducing means, provided in the surface of the stage in contact with the substrate, for filling a space between the substrate and the stage with a specified gas under a specified gas pressure, and a first window plate, made of a material substantially transparent with regard to measuring wavelengths of the infrared radiation thermometer, for dividing the vacuum atmosphere into the substrate side and the infrared thermometer side of the observation hole.

Moreover, the first object is achieved by (5) a vacuum processing apparatus according to (1) or (2) above, wherein each of the above-mentioned stages is provided with substrate temperature control means comprising a second window plate thinner than the first window between the first window plate and the wafer.

Furthermore, the first object is achieved by (6) a vacuum processing apparatus according to (1) or (2), wherein the substrate temperature control means includes the first window plate transmitting up to infrared radiation light with wavelengths longer than with the second window plate.

In addition, the first object is achieved by (7) a vacuum processing apparatus according to (1) or (2), wherein the first and second infrared radiation thermometers measure temperature at wavelengths of the same infrared region.

The first object is also achieved by (8) a vacuum processing apparatus according to (1) or (2), wherein the means for heating or cooling the substrate on the temperature calibration stage to a known specified temperature is installed outside the vacuum processing chamber.

The first object is further achieved by (9) a vacuum processing apparatus according to any of (1) to (8), wherein the means for heating or cooling the substrate on the temperature calibration stage to a known specified temperature is arranged to be in the atmosphere that has replaced the atmospheric air.

The first object is also achieved by

(10) a vacuum processing apparatus according to any of (1) to (9), wherein the means for heating or cooling the substrate in the temperature calibration stage to a known specified temperature is formed by means for bringing the substrate into thermal contact with a member with a larger heat capacity than the substrate.

The first object is still achieved by

(11) a vacuum processing apparatus according to (10), wherein the means for bringing the substrate into thermal contact with a member with a larger heat capacity than the substrate is formed by means for evacuating the space where the substrate and the member are in contact with each other.

The first object is also achieved by

(12) a vacuum processing apparatus according to any of (1) to (7), wherein the means for heating or cooling the substrate on the temperature calibration stage to a known specified temperature is in the vacuum processing chamber; and wherein there are installed the means for bringing the substrate into thermal contact with a member with a larger heat capacity than the substrate and the means for filling the space, where the substrate and the member are in contact with each other, with a gas at pressure of five pascal or higher.

The first object is also achieved by

(13) a vacuum processing apparatus according to (1) or (2), wherein a substrate temperature adjusting chamber is installed between the substrate temperature calibration stage and the vacuum processing chamber, and wherein first, second and third infrared radiation thermometers are provided for separate stages.

The first object is further achieved by

(14) a vacuum processing apparatus according to any of (1) to (13), further comprising means for measuring the substrate temperature, wherein at least one of the stages on which the substrate is held in the vacuum processing chamber is divided into two stages; a first stage where there is installed the means for heating or cooling the substrate to a specified temperature and a second stage for temperature measurement, and wherein the substrate temperature is set at the first stage and then, the substrate is moved to the second stage for temperature measurement.

The first object is also achieved by

(15) a vacuum processing apparatus according to any of (1) to (9), wherein at least one of the means for heating the substrate in the vacuum processing chamber is lamp heating means.

The first object is further achieved by

(16) a vacuum processing apparatus according to any of (1) to (13), wherein at least either means for heating or cooling the substrate on the temperature calibration stage, and second heating or cooling means is provided close to, and above the upper surface of the substrate on the temperature calibration stage, thereby controlling the substrate temperature from both sides thereof.

The first object is also achieved by

(17) a vacuum processing apparatus according to any of (1) to (12), wherein each of the stages in the vacuum processing chamber comprises temperature control means for compensating the amount of deviation of the substrate temperature from the specified setting temperature in the vacuum processing chamber, the substrate temperature being obtained from output of the second infrared radiation thermometer.

The above-mentioned second object is also achieved by

(18) a film deposition apparatus comprising:

a first infrared radiation thermometer, comprising means for heating a substrate held on a temperature calibration stage to a known setting temperature, for measuring heat radiation the substrate on the stage;

means for obtaining an emissivity from output of the first infrared radiation thermometer according to a known temperature of the substrate, and computing an infrared sensitivity correction value to correctly display the temperature of the substrate by the first infrared radiation thermometer;

a vacuum film deposition processing chamber comprising stage for holding the substrate having been calibrated on the temperature calibration stage, means for heating or cooling the substrate to a specified setting temperature, and means for vacuum film deposition processing of the substrate;

a second infrared radiation thermometer for measuring heat radiation of the substrate on the stage in the vacuum film deposition processing chamber;

means for computing a true temperature of the substrate placed in the vacuum film deposition processing chamber from output of the second infrared radiation thermometer based upon the infrared sensitivity correction value obtained by the temperature calibration stage;

temperature control means for compensating the amount of deviation of the substrate temperature from the specified setting temperature in the vacuum processing chamber, the substrate temperature being obtained from output of the second infrared radiation thermometer; and a shutter mechanism which is disposed above and close to the substrate in each of the chambers and the main face of which is formed by a member sufficiently mirror-like with respect to measuring wavelengths of the infrared thermometers.

To be more concrete, preferably, the second object is achieved by

(19) a sputter-deposition apparatus according to (18), wherein the vacuum film deposition processing chamber is capable of depositing a thin film by a sputtering method under specified conditions.

The second object is also achieved by

(20) a CVD film deposition apparatus according to (18), wherein the vacuum film deposition processing chamber is formed by a vacuum film deposition chamber capable of depositing a thin film by a CVD method under specified conditions.

The second object is further achieved by

(21) a film deposition apparatus according to (18), wherein a substrate temperature adjusting chamber is installed between the substrate temperature calibration chamber and the vacuum film deposition processing chamber, and wherein an infrared radiation thermometer is provided in each chamber.

The second object is further achieved by

(22) a film depsoition apparatus according to (21), wherein a setting temperature of the substrate temperature adjusting chamber is kept at lower or higher temperature than the substrate temperature calibration chamber and the vacuum film deposition processing chamber for the substrate.

The second object is additionally achieved by

(23) a film deposiion apparatus according to (21) or (22), wherein the vacuum film deposition processing chamber is formed by a sputter-deposition chamber.

The third object is achieved by

(24) a film deposition method by a film deposition apparatus according to (18), comprising the steps of:

holding a specified substrate on the stage in the substrate temperature calibration chamber and heating the substrate to a specified temperature;

after cooling the substrate to a specified temperature under vacuum and transferring the substrate to the stage in the vacuum film deposition processing chamber starting film deposition, and controlling the substrate temperature so as to be a specified first setting temperature of film deposition;

depositing a film to a specified thickness with controlling the substrate temperature to be a second setting temperature higher than the first setting temperature of film deposition; and after the film deposition is finished, quenching the substrate to lower than the second setting temperature of film deposition.

Again, the third object is achieved by

(25) a film deposition method according to (21) comprising the steps of:

holding a specified substrate on the substrate temperature calibration stage for film deposition processing and heating the substrate to a specified temperature;

then, transferring the substrate to the stage in the substrate temperature adjusting chamber and cooling the substrate to a specified temperature;

then, starting a first film deposition by transferring the substrate to the stage in the vacuum film deposition processing chamber and controlling the first film deposition temperature;

increasing the grain size of the crystal grains of the deposited film by greatly reducing the film deposition rate once, having the substrate on the substrate temperature adjustable stage, and keeping the substrate at a second setting temperature higher than the first film deposition temperature;

performing a second film deposition to a specified film thickness with controlling the substrate temperature to be a third film deposition temperature higher than the second setting temperature; and quenching the substrate.

The fourth object is achieved by

(26) a substrate temperature measuring method comprising the steps of setting a substrate whose temperature is measured and an infrared radiation thermometer for measuring the substrate temperature and providing a mirror-like face, which has a reflectance sufficient at measuring infrared wavelengths, on the surface of the substrate which is opposite the surface where the substrate temperature is measured and in a position substantially perpendicular to the measuring optical axis by the infrared radiation thermometer.

Or, the fourth object is achieved by

(27) a substrate temperature control method comprising the steps of:

using a substrate which undergoes a heating or cooling process, an infrared radiation thermometer for measuring a temperature of the substrate, and a highly reflective body with a mirror-like face having a sufficiently high reflectance at measuring wavelengths and placed on the side of the substrate which is opposite the side facing the infrared radiation thermometer, and heating or cooling means for the processes mentioned above.

Preferably, the fourth object is achieved by

(28) a substrate temperature control method according to (27), wherein the heating or cooling means controls the substrate to a specified temperature according to measured values from the infrared radiation thermometer.

Or, the fourth object is achieved by

(29) a substrate temperature control method according to (27) and (28), wherein the mirror-like face can be moved to the optical axis of the infrared radiation thermometer on the opposite side of the substrate when necessary.

Or, the fourth object is achieved by

(30) a substrate temperature control method according to (27) to (29), further comprising means for setting a second heating condition for the substrate so that the heating means performs at least first and second heating, and after the first heating, the substrate temperature is measured using the mirror-like face and the infrared radiation thermometer, from the result of which the second heating condition is set for the substrate to be heated to a final target heating temperature in the second heating.

Or, the fourth object is achieved by

(31) a substrate temperature measuring method according to (27) to (30), wherein body with a sufficiently low reflectance at measuring wavelengths, which is contrary to the mirror-like face, can be introduced at a place where the mirror is located.

The functions of the above-mentioned means for achieving the objects will be described.

Before a specified process is performed on the substrate in the vacuum processing chamber, on the temperature calibration stage the substrate is heated or cooled to a known temperature and the substrate temperature is measured with the first infrared radiation thermometer along with a thermocouple. According to a measurement result, a correction value, that is to say, an emissivity of the infrared radiation thermometer is obtained by arithmetic operations. According to a result of this arithmetic operation, the substrate temperature in the subsequent vacuum processing chamber is measured accurately with the second and third thermometers. Based on a result of this measurement, the temperature control system is operated to set the substrate temperature in the vacuum processing chamber to a specified value, so that vacuum processing such as film deposition is performed under precise temperature control.

If temperature measurement for calibration with the first infrared radiation thermometer and the thermocouple is performed at different temperatures, an in-process temperature control in a wide temperature range is made possible in the subsequent control of the substrate temperature in the vacuum processing chamber.

Furthermore, if a plurality of heating or cooling means are provided for temperature measurement for calibration with the first infrared radiation thermometer and the thermocouple, calibration at different temperatures can be carried out in a short time.

If a lamp with measuring wavelengths is used instead of the first infrared thermometer mentioned above, from its reflectance and transmittance you can obtain the absorbance and subsequently the emissivity.

So long as the products are of the same type, it may be only necessary to find a calibration value for each lot.

In order to measure the substrate temperature with an infrared radiation thermometer while the substrate is heated or cooled, it is required to provide a through-hole (aperture) in the heating or cooling stage. The presence of this through-hole sometimes causes nonuniformity in the temperature distribution of the substrate. A possible solution is to heat both the top and back sides of the substrate. It is also possible to bisect the stage, and use one of the bisected substrate heating or cooling stage as a stage dedicated to temperature control without providing this stage with an aperture but provide the other stage with an aperture for temperature measurement, and when measuring the substrate, move the substrate from one stage to the other stage for temperature measurement.

In this invention, if a shutter is installed close to the substrate for measuring the substrate temperature, it plays important roles in order to make accurate temperature measurement of the substrate.

The first role is that for an apparatus for depositing a metal film by sputtering or CVD, etc., by the shutter installed as described the same infrared emissivity can be obtained that is given by a deposited metal film whether there actually exists a metal film or not. The second role is that the shutter blocks stray light passing through the substrate and is incident on the infrared radiation theremometer, thereby preventing measurement errors due to stray light.

This shutter mechanism is invariably required particularly for measuring the substrate temperature before a film is deposited. When an absorber is used along with the shutter, in measurement using an absorber, the level of stray light component can be found accurately, making it possible to be constantly aware of limits of measurement due to stray light.

The other functions which have not been mentioned will be described in detail when referring to embodiments of this invention.

BEST MODE OF CARRYING OUT THE INVENTION

Figure 1:
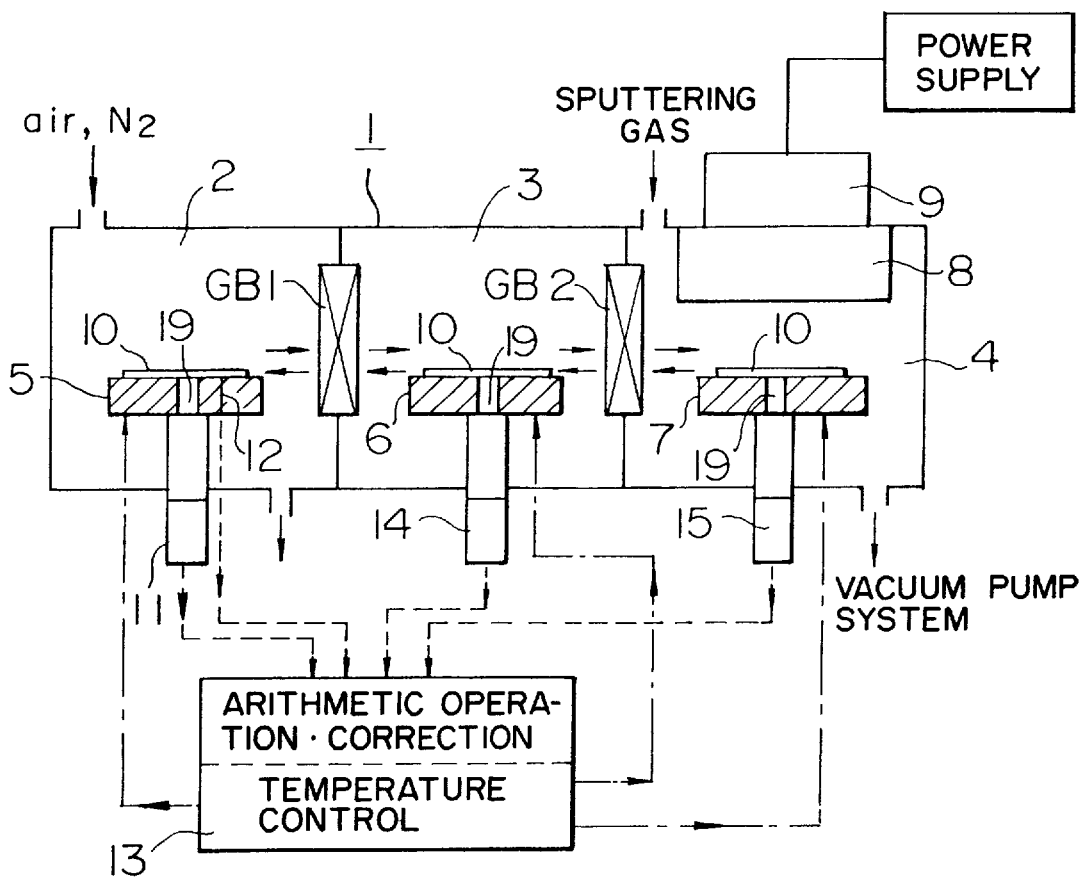
FIG. 1 is a block construction diagram, partly in cross section, for schematically explaining the vacuum processing apparatus as an embodiment of this invention.

In order to achieve the objects, the present inventors have made studies which will be described below, and obtained various findings.

Specifically, in this invention, to use as the main means for temperature measurement, the infrared radiation thermometer is calibrated for each substrate (a silicon wafer, for example). More specifically, before substrates are processed by the vacuum processing apparatus concerned, each substrate is heated or cooled to a known temperature, and the substrate temperature is measured by the first infrared radiation thermometer at one or more temperatures. According to the indicated values of the first infrared radiation thermometer, correction values are applied to the infrared radiation thermometer in the vacuum processing chamber, a process step subsequent to the temperature calibration stage. Needless to say, it is possible to obtain the emissivity by other means. Also, the above calibration step may be done at each lot for some products, thereby saving labor. To be more specific, by determining this correction value beforehand, rough correction can be done, for example. Or, if the target temperature range is narrow, by using a mere coefficient, the infrared radiation thermometers in the process steps following the temperature calibration stage are calibrated. Another possible method is that when there are a plurality of temperature calibration points, temperature calibration data at the respective points are entered into the computer to perform arithmetic operations for correction.

The above-mentioned temperature calibration stage need not be in a vacuum, but may be placed in the environment under atmospheric pressure. Under atmospheric pressure, the apparatuses are normally configured in simple form, and moreover, the temperature of wafers to be processed can be readily approached to the temperature of the heat block (stage) heated or cooled to a known temperature.

To be more concrete, when the temperature calibration stage is set under atmospheric pressure, by using a vacuum chuck for the stage, the substrate can be attached tightly to the heat block having a larger heat capacity than the substrate. By so doing, the substrate temperature can be brought close to the heat block temperature.

When it is necessary to select high temperatures at the temperature calibration points, problems arise such as the substrate surface to be processed being oxidized by the atmospheric air. Therefore, for the atmosphere in the chamber where the temperature calibration chamber is located, it is desirable to fill the chamber having the temperature calibration stage placed therein with a substitution atmosphere such as nitrogen or argon to displace the atmospheric air.

When the temperature calibration stage is set under vacuum, to facilitate heat conduction between the heat block and the substrate, a heating or cooling gas is made to exist under a pressure of five pascal or higher between the heat block and the substrate, so that the substrate temperature can be approached to the heat block temperature in a relatively short time.

For example, in an apparatus for depositing a thin film on a substrate by the sputtering method, when bringing a substrate, which has been in the atmospheric air, into the vacuum processing chamber, it is sometimes necessary to heat the substrate to 150° C. or higher to sufficiently get rid of water vapor adsorbed in the surface of the substrate or conversely, it is at times necessary to heat the heated substrate to a film deposition start temperature of about 100° C., for example, in the vacuum chamber. At raising or lowering the temperature, accurate temperature measurement is required for temperature control. The infrared radiation thermometers for this measurement need to be calibrated for each piece of substrate or for different types of substrates. A process can be organized which is suitable for manufacturing electronic parts if the process is provided with a function to calibrate one or more second infrared radiation thermometers used for subsequent vacuum processes according to measurement results by the first infrared radiation thermometer of the substrate which is heated or cooled to a known temperature prior to a specified vacuum process and a film deposition apparatus is formed which requires precise control of the substrate temperature, such as a sputter-deposition apparatus or a CVD apparatus.

In measurements by the first and second infrared radiation thermometers mentioned above, the use of wavelengths of the same infrared region assures accurate calibration.

When the calibration of the first infrared radiation thermometer at a known temperature is done with the heated substrate, this calibration step can be made to serve also as the so-called baking process to get rid of the water vapor adsorbed in the substrate if the heating to the known temperature is done in a vacuum. Therefore, the apparatus can be reduced in size, which is a desirable case.

For example, when the substrate is heated in the vacuum processing chamber of a sputter-deposition apparatus, if the infrared radiation thermometer has been calibrated in advance, lamp radiation heating can be performed instead of using the heat block, which enables a less-expensive sputter-deposition apparatus to be formed.

When lamp heating is used in the vacuum processing chamber, the lamp light may sometimes enter the infrared radiation thermometer as stray light. Therefore, it is essentially desirable that the measuring wavelengths of the infrared radiation thermometer are in a wavelength region different from radiation wavelengths of the lamp.

In order to increase incident infrared light from the substrate to the infrared thermometer and to reduce stray light, a mirror-like face is placed on the side of the substrate which is opposite the side facing the infrared thermometer. If this is done, it is possible to measure the temperature in the middle of lamp heating and according to measurement results, decide an additional heating condition.

When a silicon wafer is used, for example, as a substrate, since the silicon wafer is substantially transparent in the infrared region, efficient heating cannot be performed with a quartz-glass-containing infrared lamp in wide use. Light of this kind of infrared lamp tends to become stray light to the infrared radiation thermometer. It is desirable to use a lamp of short wavelengths which are absorbed by a silicon wafer at a high absorbance.

If the starting temperature of film deposition in the vacuum processing chamber is lower than the baking temperature in a vacuum to deprive the substrate of the adsorbed water vapor, after baking is over, the substrate needs to be cooled to a specified temperature in the vacuum chamber to set the substrate at a specified film deposition starting temperature. To achieve this film deposition process with high accuracy, it is necessary to provide a sputter-deposition apparatus comprising a stage having a first infrared radiation thermometer for temperature calibration in the temperature calibration chamber, a stage for baking the substrate in a vacuum, a stage for cooling the substrate to a specified starting temperature of film deposition prior to film deposition, and a second infrared radiation thermometer capable of accurately measuring the substrate temperature on the cooling stage by computing and using a correction value obtained with the first infrared radiation thermometer. However, the part for temperature calibration need not necessarily be mounted close to or built in what is referred to as the sputter-deposition apparatus main body.

To observe the substrate with the infrared radiation thermometer, it is necessary to provide the cooling stage with a through-hole (aperture) for observation. This sometimes causes nonuniformity in the temperature distribution. In this case, the stage in the same chamber is divided into two parts which are adjusted to be at the same temperature. More precisely, one heating or cooling stage is not provided with an aperture for substrate temperature observation, while the other temperature measuring stage is provided with an aperture. By quickly transferring the substrate which has been heated or cooled on one stage to the other stage to measure the substrate temperature, the above-mentioned nonuniformity in the temperature distribution can be reduced.

By providing a plurality of temperature calibration points, the in-process temperature can be controlled accurately. If a plurality of heating or cooling means are provided in the substrate temperature calibration chamber, the thermometer calibration at a number of temperatures can be carried out in a short time.

For an apparatus for depositing a metal film by sputtering, a shutter to reflect radiating infrared light needs to be provided over the surface of the substrate which is opposite the surface where a deposited metal film is observed. The shutter will be described later. But for the shutter, depending on the presence or absence of the deposited film, the infrared radiation incident on the infrared radiation thermometer varies greatly, and therefore, the apparent infrared emissivity varies. When there is the shutter, almost all infrared light, which would otherwise radiate to the surface of the substrate which is opposite the surface observed by the infrared radiation thermometer, is reflected. Therefore, the difference in the apparent infrared emissivity between before and after film deposition can be reduced remarkably.

In the heating or cooling stage for the substrate, when a shutter mechanism having a main surface formed by a member whose face is sufficiently mirror-like with respect to measuring wavelengths of the infrared radiation thermometer is disposed close the top surface of the substrate which is opposite the surface observed by the infrared radiation thermometer through the aperture of the state.

Based on the foregoing findings, this invention has been made. With reference to the accompanying drawings, an embodiment of this invention will be described.

Embodiment 1

FIG. 1 is a schematic construction diagram showing an embodiment in which the vacuum processing apparatus of this invention is applied to a sputter-deposition apparatus. With regard to this embodiment, to show a typical example, description will be made of a case in which the substrate on which a film is deposited is a silicon wafer and a thin film of Al is deposited on the silicon wafer by sputtering.

The vacuum processing apparatus 1 according to this invention comprises a substrate temperature calibration chamber 2 including a substrate temeprature calibration stage 5, a substrate temperature adjusting chamber 3 including a substrate temperature adjusting stage 6 for heating and cooling a substrate, and a sputter-deposition chamber 4 including a sputter-deposition stage 7, an Al target 8 and a sputtering electrode 9. Those chambers are independent of each other, but connected through gate valves GV1 and GV2. The substrate temperature calibration chamber 2 and the sputter-deposition chamber 4 are connected with a vacuum pump system. On one side, the chambers can be maintained under vacuum, and on other side, specified gases can be introduced into the chambers through gas inlets. For the substrate temperature calibration chamber 2, air or nitrogen gas can be introduced to set the inside pressure up to atmospheric pressure. For the sputter-deposition chamber 4, a sputtering gas is introduced, and the inside environment can be set such that plasma is produced by specified electric discharge. As will be described later, each stage is provided with heating or cooling means and an aperture 19 formed by a through-hole for observing infrared radiation from the substrate 10. Those stages are connected respectively with first, second and third infrared radiation thermometers, thereby providing optical coupling through the aperture 19. The substrate temperature calibration stage 5 is equipped with a thermocouple 12 to accurately measure the temperature of the substrate temperature calibration stage 5. And the vacuum processing apparatus comprises a substrate temperature controller 13 for temperature control of the so-called whole vacuum processing apparatus, that is, for setting and controlling the stage temperatures to specified values by receiving output from the infrared radiation thermometers and output from the thermocouple 12, carrying out an arithmetic operation of the emissivity of the first infrared radiation thermometer 11, making corrections for the second and third infrared radiation thermometers 14 and 15 according to arithmetic operation results, thereby measuring correct temperatures of the substrates 10 on the stages, and finally feeding back to the heating or cooling means of the stages commands to set required stage temperatures according to those measured data.

As for the functions of the chambers, the substrate temperature calibration chamber 2 normally measures infrared radiation from the substrate 10 set at a known temperature higher than the film deposition starting temperature with the first infrared radiation thermometer 11, computing the emissivity, thereby calibrating this infrared radiation thermometer. The substrate temperature adjusting chamber 3 has a function to adjust the substrate temperature before the substrate is transferred to the subsequent sputter-deposition chamber 4. The sputter-deposition chamber 4 has a function to deposit a film on the substrate by sputtering.

Description will now be made of a concrete example in which the temperature of each stage is controlled to maintain the substrate 10 at specified temperature, and a thin film of Al is deposited on a silicon wafer substrate 10 by sputtering which dislodges atoms from the Al target 8 and deposits them on the silicon wafer 10.

To begin with, in the substrate temperature calibration chamber 2 kept at atmospheric pressure, the wafer is heated step by step to three temperature points of 200° C., 300° C., and 400° C. The heating and cooling methods at the stages 5, 6 and 7 will be described collectively later on. The back side of the substrate 10 heated on the calibration stage 5 is observed and measured by the first infrared radiation thermometer 11 and the thermocouple 12, and the indicated values of the respective temperature steps are obtained by the processing unit of the substrate temperature controller 13. Specifically, the temperature of the calibration stage, which is in equilibrium with the substrate temperature, is measured with the thermocouple 12. Using the measured temperature as the substrate temperature, the emissivity at this time is observed with the infrared radiation thermometer 11, and an indicated temperature value based on this emissivity is thereby obtained by the processing unit of the substrate temperature controller 13.

Since the wafer 10 has been heated and set at a known temperature, the emissivity obtained with the first infrared radiation thermometer 11 can be computed by inverse arithmetic operation. The processing temperatures in the subsequent substrate temperature adjusting chamber 3 and the sputter-deposition chamber 4 under vacuum are read by using the above-mentioned emissivity and correcting the emissivity by data from the second and third infrared radiation thermometers 14 and 15.

When the emissivity by the first infrared radiation thermometer 11 has been calibrated, the substrate temperature calibration chamber 2 is evacuated to vacuum state, and then, as the gate valve GV1 is opened, the wafer 10 is transferred from the calibration chamber 2 to the substrate temperature adjusting chamber 3 which is in a vacuum state, and the substrate temperature is measured with the second infrared radiation thermometer 14. According to measurement results, the temperature of the stage 6 is adjusted by the substrate temperature controller 13 so that the wafer 10 will be set at a light optional temperature. In this example, the wafer 10 was set at 100° C. Then, as the gate valve GV2 is opened, the wafer 10 is transferred to the stage 7 of the evacuated sputter-deposition chamber 4, and the temperature of the wafer 10 is measured with the third infrared radiation thermometer 15. According to measurement results, the stage 7 is adjusted to an optional temperature, and with the temperature of the substrate 10 thus controlled to an optional temperature, sputter-deposition is performed. In this example, the wafer 10 was set at 250° C., and sputter-deposition of Al was performed. After sputter-deposition was finished, the wafer 10 was transferred again to the calibration chamber 2, where the emissivity was calibrated again, and the calibrated emissivity was used for correction at temperature measurement in subsequent sputter-deposition operations.

As a simplified means for transportation between the chambers, a transfer mechanism, robot or the like using a heat-resistant belt of silicon rubber, for example, is used.

Figure 2:
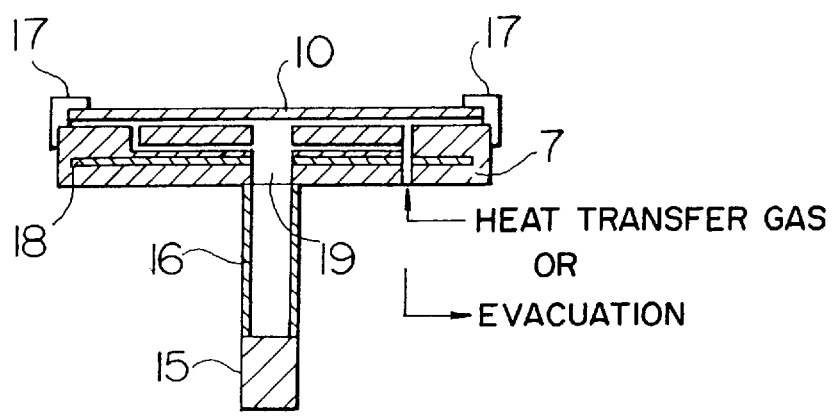
FIG. 2 is a cross sectional construction diagram showing an example of a sputtering stage.

With reference to FIG. 2, the outline of the construction of the stage for holding a substrate, the heating and cooling methods, and the wafer emissivity measuring methods will be described using the sputtering stage 7 as an example.

(1) The construction, and heating and cooling methods of the substrate stage:

The sputtering stage 7 has built therein an electric heater 18 for heating the stage. The sputtering stage 7 is so constructed as to conduct therethrough a heat transfer gas such as air or nitrogen gas to transmit heat to the wafer in a vacuum. And, a clamp 17 is mounted which makes the heat transfer gas contact the wafer uniformly. An aperture 19 is provided which forms an infrared radiation observation hole to measure the wafer temperature with the infrared radiation thermometer 15. To cool the wafer, a cooling medium such as Freon is circulated to cool the stage instead of using the heater 18, and the wafer is cooled by a heat transfer gas in the same manner as mentioned above.

At the calibration stage 5, since the inside of the chamber is at atmospheric pressure, a heat transfer gas is not used, the chamber is evacuated, and while the closeness to the stage is ensured by use of a vacuum chuck, the wafer is heated by heat conduction.

(2) Emissivity measurement:

Next, description will be made of the method of measuring the temperature of a wafer substrate with an infrared radiation thermometer. In this embodiment of this invention, the infrared radiation thermometers 11, 14, and 15 are located at the lower ends of the stages, and used to measure the temperatures of the back sides of the wafers. In order that stray light of the inside of the chambers is not incident on the infrared radiation thermometers, stray-light-shielding cylinders 16 are provided between the stages and the infrared radiation thermometers.

In this embodiment, the processing in a vacuum is the deposition of Al to the substrate by sputtering. When metallic Al is deposited on a substrate, the emissivity increases greatly by the amount infrared light reflected by the Al film. Therefore, the emissivity obtained by measurement in the substrate temperature calibration chamber prior to film deposition cannot be used in subsequent film deposition processes.

In this invention, the wafer on which a film has been deposited is heated again to a known preset temperature in the calibration chamber, the emissivity is measured on the newly formed surface, and calibrated. Therefore, by measuring the wafer temperature with the infrared radiation thermometer on completion of film deposition and calculating a correct emissivity by emissivity measurement after film deposition (second emissivity measurement), a correct wafer temperature just after the film deposition can be known.

For example, if the wafer temperature after the film deposition is too high, the setting heating condition is changed such that the heat quantity given to the wafer during film deposition or before film deposition is smaller.

If it is desired to decrease only the temperature just after the film deposition without changing the setting temperature at the start of film deposition, the set cooling condition of the substrate receiving film deposition can be changed by cooling the substrate stage by gas, and adjusting the gas pressure at the back side of the substrate.

In the above embodiment, a case has been described in which a silicon wafer is used as the substrate and a thin film of Al is desposited on the wafer by sputtering. Because temperature control of the substrate can be implemented with high accuracy by the use of the stage, in actuality, a film could be deposited which is of high quality and crystallinity with good reproducibility.

Embodiment 2

Figure 3:
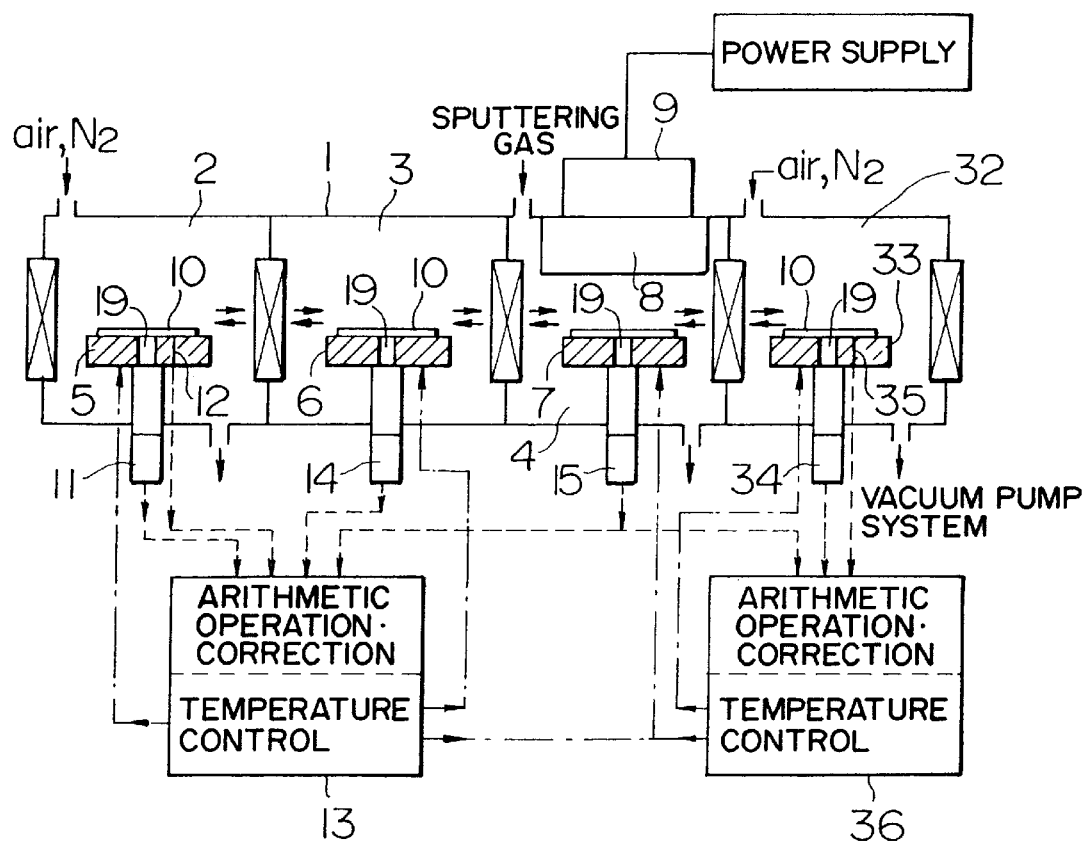
FIG. 3 is a block construction diagram, partly in cross section, for schematically explaining the vacuum processing apparatus as another embodiment of this invention.

When a metal film is deposited on the side of the substrate 10 which is opposite the side observed with an infrared radiation thermometer, the apparent infrared emissivity sometimes greatly differs with the presence or absence of the film. FIG. 3 shows an example in which in a sputter-deposition apparatus for the same purpose as above, a second temperature calibration chamber 32 is added to the sputter-deposition chamber 4 of FIG. 1 in order to calibrate the infrared emissivity of the substrate after film deposition.

During film deposition by sputtering, the substrate temperature is measured with the infrared radiation thermometer 15. In this case, however, a metal film has already been deposited on the surface of the substrate 10, and therefore, the correction value of the infrared emissivity obtained at the substrate temperature calibration stage 2 cannot be used. For this reason, after the sputter-deposition is finished, the substrate 10 is transferred from the sputter-deposition chamber 4 to the second temperature calibration chamber 32, where like in the temperature calibration chamber 2, the substrate 10 is heated or cooled with the heating or cooling stage 33 to a specified temperature. The substrate temperature is measured with the infrared radiation thermometer 34 and the thermocouple 35, and from both indicated values, the infrared emissivity of the film-deposited substrate 10 at a specified temperature is calculated. When this emissivity value is used to correct temperature data obtained during film deposition, the temperature of the substrate receiving a film deposition process can be known accurately. If the temperature of the substrate 10 on which a film is being deposited is too high, correction values are fed back, as you feel adequate, to the heating or cooling means of the substrate temperature adjusting chamber 3 in order to adjust the substrate temperature to an appropriate level. By this data feedback control, the film deposition process can be performed appropriately for the subsequent wafers.

Incidentally, the temperature calibration chamber for calibrating the infrared emissivity of the substrate after film deposition need not necessarily be separate from the temperature calibration chamber for calibrating the infrared emissivity of the substrate before film deposition like in this example. In other words, after film deposition is finished at the sputter-deposition chamber 4, the substrate may be transferred back to the temperature calibration chamber 2 across the substrate temperature adjusting chamber 3, and in the temperature calibration chamber 2, perform the infrared temperature calibration in the same way as in the second temperature calibration chamber 32.

Embodiment 3

In the foregoing embodiments 1 and 2, since the emissivity of the substrate changes after a film is deposited on it, it is necessary to calibrate the emissivity over again. In this embodiment 3, an improvement has been made and it is possible to correct the emissivity of other infrared radiation thermometers in subsequent film deposition processes according to the emissivity of a preceding infrared radiation thermometer which has been calibrated once.

Like in the embodiment 1, this embodiment will be described by using as an example an apparatus which deposits aluminum on a silicon wafer substrate by sputtering.

Figure 4:
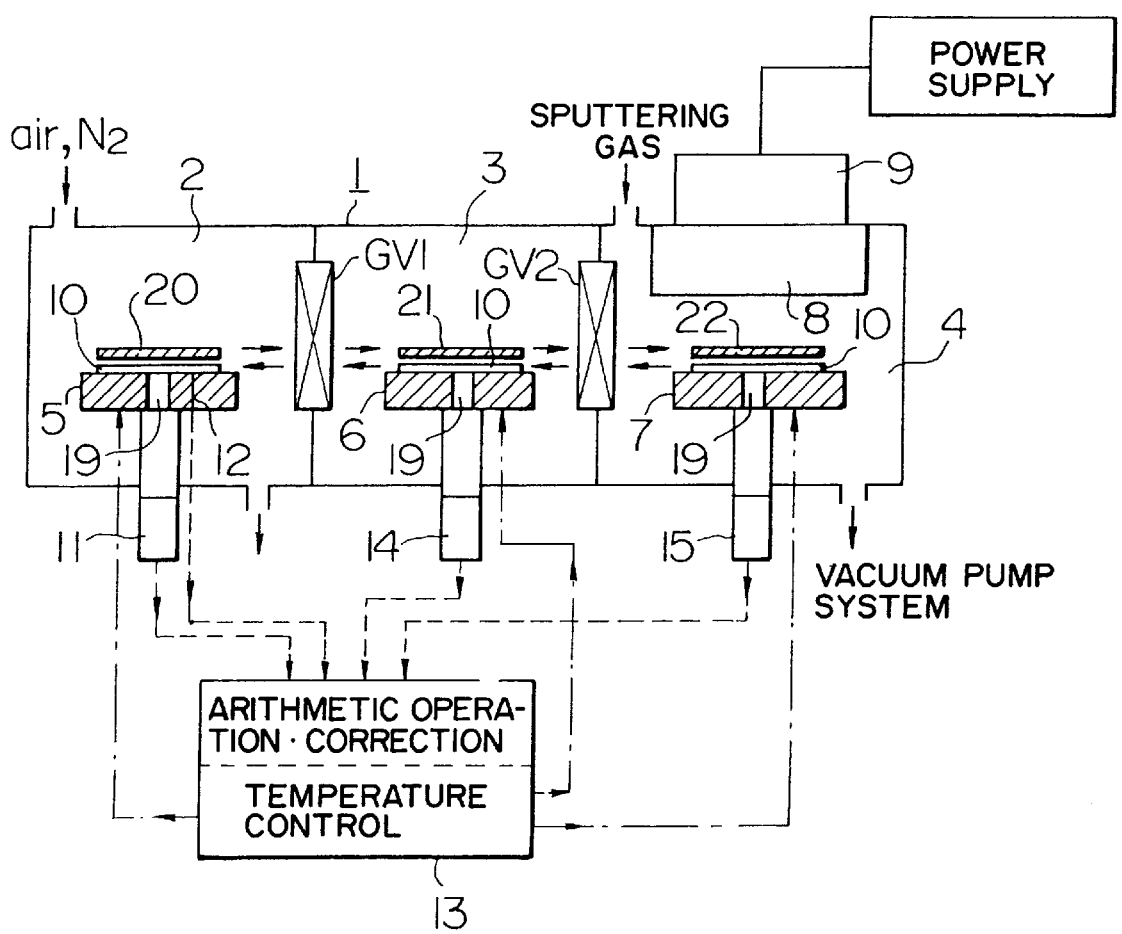
FIG. 4 is a block construction diagram, partly in cross section, for schematically explaining the vacuum processing apparatus as still another embodiment of this invention.

FIG. 4 is a schematic construction diagram of the sputter-deposition apparatus. This construction is basically the same as in FIG. 1, only difference being that shutters 20, 21 and 22 are disposed close to the substrates 10 on each stage as described in detail later.

A substrate 10 is first heated or cooled to a specified temperature by the heating or cooling stage 5 in the temperature calibration chamber 2, the substrate temperature is measured with the first infrared radiation thermometer 11 and the thermocouple 12, and from indicated values of the two measuring elements, the infrared emissivity of the substrate 10 at a specified temperature is calculated. When a metal film is deposited by sputtering on the side of the substrate which is opposite the side observed with the infrared radiation thermometer, the apparent infrared emissivity sometimes greatly varies with the presence or absence of a deposited film. This provision of a shutter can reduce the difference in the apparent infrared emissivity ascribable to the presence or absence of a deposited film.

During measurement by the infrared radiation thermometer 11, the shutter 20 is closed.

Then, the substrate 11 is transferred from the temperature calibration chamber 2 to the substrate temperature adjusting cahmber 3, and while the substrate is heated or cooled on the heating or cooling stage 6, the temperature of the substrate 10 is measured with the second infrared radiation thermometer 14. The measurement data is corrected by the emissivity of the substrate 10 at a specified temperature, obtained at the calibration chamber 2, and accordingly, the substrate temperature controller 13 adjusts the temperature of the heating or cooling stage 6 to a specified temperature to control the temperature of the substrate 10 to a specified temperature. As in the temperature calibration chamber 2, the temperature measurement at this substrate temperature adjusting chamber 2 is performed with the shutter 21 closed.

Then, the substrate 10 is transferred to the sputter-deposition chamber 4, where it is heated or cooled on the sputtering stage 7. At this time, the shutter 22 is closed over the substrate, and the substrate temperature is measured with the third infrared radiation thermometer 15. Measurement data is corrected by the emissivity value of the substrate 10 in the calibration chamber 2 to obtain a correct temperature of the substrate 10. In addition, as the correct temperature of the substrate is known, the temperature of the heating or cooling stage 7 is adjusted through the work of the substrate temperature controller 13 to control the substrate 10 to a specified temperature, making it possible to start sputter-deposition. After a film has been deposited, the substrate 10 is brought back to the substrate temperature adjusting chamber 3, and while the substrate is heated or cooled on the stage 6, the substrate temperature is measured with the second infrared radiation thermometer 14. By correcting the measured data by the value of the substrate emissivity at a specified temperature obtained in the calibration chamber 2, the temperature of the stage 6 is adjusted to a specified temperature by the substrate temperature controller 13, thereby setting the substrate temperature to a specified temperature. Then, the substrate is discharged from the temperature calibration chamber 2, and sent from the vacuum processing apparatus 1 to the next process.

More accurate control of process temperature will be achieved if the temperature measurement of the substrate 10 by the first infrared radiation thermometer 11 and the thermocouple 12 at the substrate temperature calibration stage 2 is performed at a plurality of temperatures and the second and third infrared radiation thermometers 14 and 15 are used. If a plurality of substrate heating or cooling means are provided for measurement of the substrate temperature with the first infrared radiation thermometer 11, it is possible to calibrate the substrate temperature at the same number of temperatures in a short time.

Description has been made of a case in which the temperature calibration section is built in the sputter-deposition apparatus, but it can be provided separately as mentioned above. Also, means for measuring the reflection and transmission can be used instead of the first infrared radiation thermometer.

Figure 5:
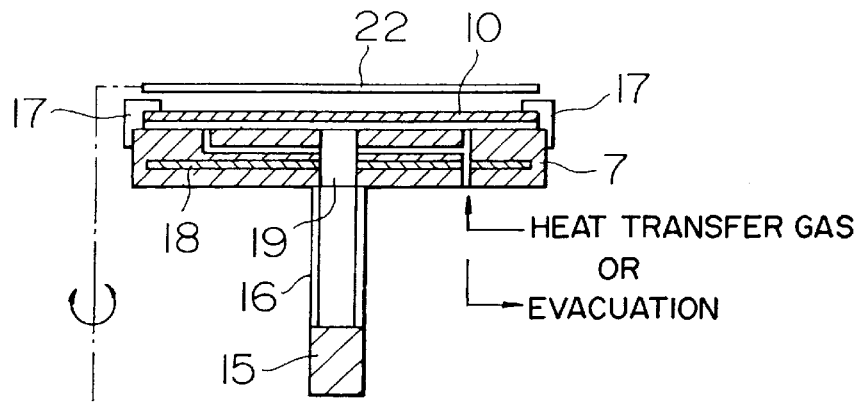
FIGS. 5 and 6 are schematic cross-sectional construction diagrams respectively showing examples of sputtering stage and substrate temperature adjusting stage each having a shutter mechanism.

As a representative example of the stage, FIG. 5 shows a schematic construction diagram of the sputtering stage 7 of FIG. 4. The stage construction is basically the same as in the example shown in FIG. 2, only difference is that a shutter 22 is provided above and close to the substrate 10.

When a metal film is deposited by sputtering on the side of the substrate which is opposite the side observed by the infrared radiation thermometer, the apparent infrared emissivity sometimes greatly varies with the presence or absence of a deposited film. The provision of this shutter makes it possible to reduce the difference in the apparent infrared emissivity due to the presence or absence of a deposited film. Therefore, it is only necessary to make one measurement by the infrared radiation thermometer for temperature calibration instead of twice, that is, before and after the film deposition by additionally installing a second temperature calibration chamber 32.

This shutter is freely openable, that is, it closes the top surface of the substrate when measuring the substrate temperature, and it opens during film deposition. For example, a stainless disc is supported by a rotatable drive shaft, and this drive shaft is rotated to open and close the disc shutter.

Since the silicon wafer substrate 10 is substantially transparent to infrared light, it sometimes happens that stray light passes through the substrate and is incident on the infrared radiation thermometer, thus deteriorating the measuring accuracy of the substrate temperature. In this embodiment, as a countermeasure, a shutter 22 having a main surface formed by a member which is substantially mirror-like to the measuring wavelength of the infrared radiation thermometer is provided close to the side of the substrate which is opposite the side observed by the infrared thermometer. The shutter is arranged to block the incident stray light during measurement of the substrate temperature by the infrared radiation thermometer 15.

As described, the first role of the shutter mechanism is to correct the increase in the apparent emissivity due to the radiation light from the wafer which is reflected by a metal film when a metal film is deposited on the wafer substrate. The second role is to improve the measuring accuracy by the resulting improvement in the intensity of the infrared radiation light. The third role is to intercept the stray light.

Figure 6:
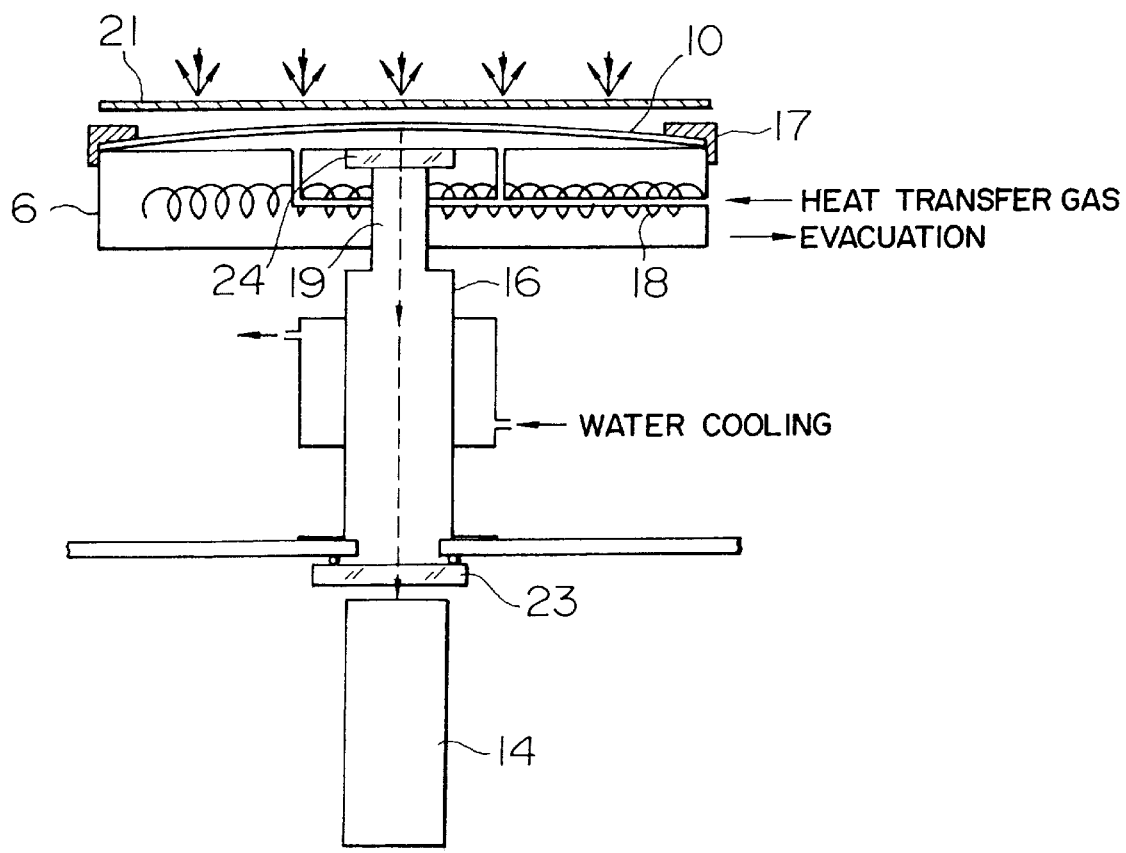

FIG. 6 is a schematic construction diagram of the stage 6 of FIG. 4. The construction is basically the same as in the stage 7 of FIG. 5. The stage 6 is provided with a heater and is so constructed as to conduct a heat transfer gas through a space between the stage 6 and the substrate 10 in a vacuum environment. The stage 6 is also provided with a clamp 17 to make the heat transfer gas contact the substrate uniformly. The stage 6 is connected with an aperture member 19 for measurment of the substrate temperature by the infrared radiation thermometer 14 and with a cylinder 16 for intercepting the stray light. Window plates 23 and 24 of a material transmitting infrared light are attached to opposite ends of the cylinder 16. The cylinder 16 is water-cooled not to allow the cylinder itself to be heated and become a stray light source. To further reduce the effect of stray light, the cylinder 16 is water-cooled and the internal walls of the cylinder 16 is processed to become a black body. In this example, too, a shutter 21 is provided close to the substrate 10 like in the stage in FIG. 5.

This shutter may be of any construction so long as the shutter (1) has an infrared reflectance as the mirror-like face or (2) has a function to block stray light. For example, it is possible to adopt a construction that the shutter is driven to freely open or close in synchronism with the timing of substrate temperature measurement or a construction that a stationary shutter is provided in a certain region of the chamber, and the substrate is moved under the shutter when measurement is made. If the wafer temperature drops when the shutter is placed above the wafer, it is only necessary to preheat the shutter temperature roughly close to the wafer temperature.

Figure 7:
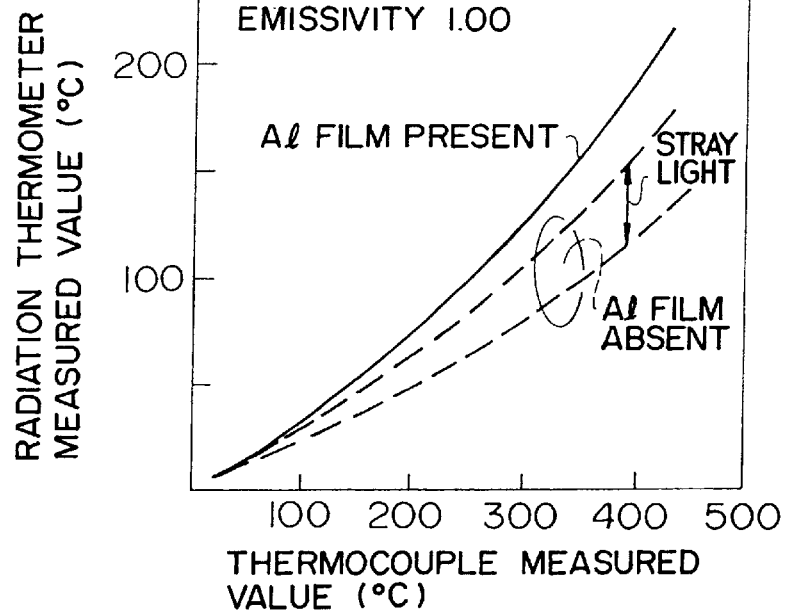
FIGS. 7(a) and 7(b) show characteristic curves showing temperature measurement results with or without a shutter.
Figure 7:
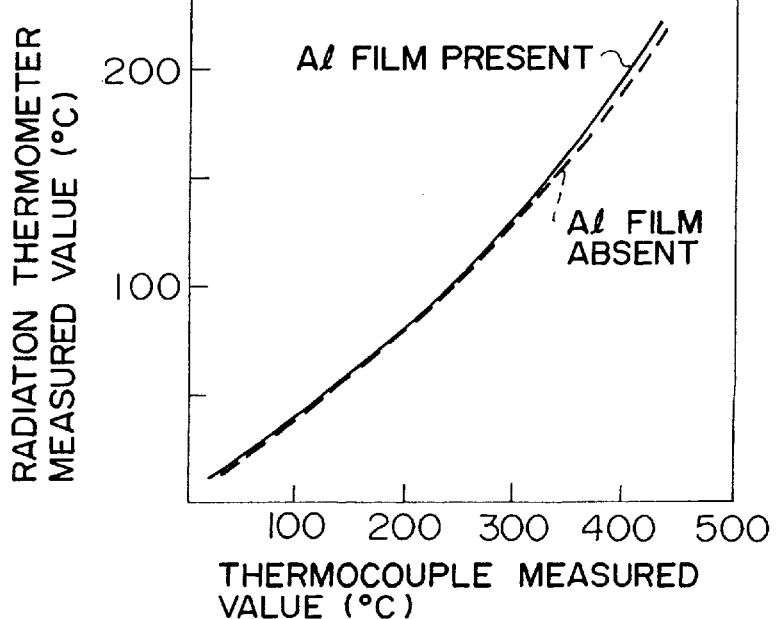

FIGS. 7(a) and 7(b) are characteristic curves showing a difference in the infrared emissivity of the silicon wafer substrate attributable to the presence or absence of the shutter. FIG. 7(a) shows a comparative example in which a shutter is not provided. FIG. 7(b) shows measurement results in this embodiment in which a shutter is provided. Obviously, the apparent infrared emissivity of the wafer prior to Al film deposition (Al film absent) is smaller than that of the wafer on which an Al film has been deposited (Al film present), and there is a considerable difference between the two cases. It was clarified that by providing a shutter for the wafer before Al film is deposited, the apparent infrared emissivity can be made substantially equal to that of the wafer after Al film deposition. Thus, it has been made clear that the wafer temperature can be measured with a fixed emissivity by using a shutter during measurement.

Embodiment 4

Figure 8:
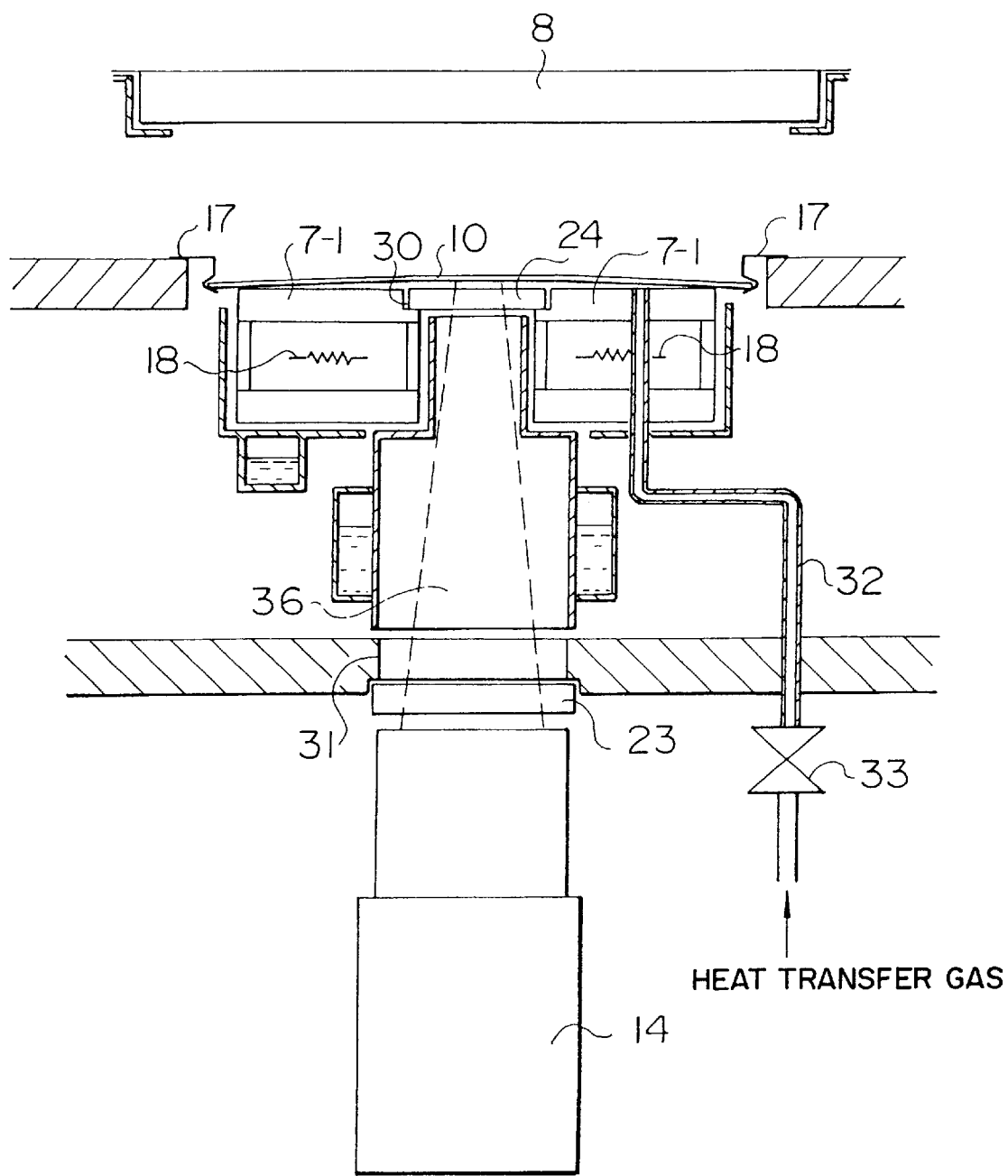
FIG. 8 shows an embodiment of this invention using a preferred combination of materials of the window plate.

The window plate for temperature observation made of a material substantially transparent to measuring wavelengths of the infrared radiation thermometer emits a radiant light as its own temperature rises, which determines the lower limit of measuring temperature. In this embodiment 4, with reference to the sputtering stage 7 of FIG. 8, description will be made of a case in which the lower limit of measuring temperature can be decreased by using different materials for the first and second window plates. This embodiment does not use a shutter above the substrate. However, needless to say, the same object can be achieved by using a shutter.

The sputtering stage 7-1 has an electric heater 18 built therein. If a refrigerant such as liquid nitrogen, for example, is introduced into the inside of the sputtering stage 7 in place of the heater, the stage 7 can be used to cool the substrate.

Reference numeral 30 indicates an opening provided in the sputtering stage 7-1, and has the first window plate 24 fitted therein. Its material will be described later. At any rate, a material transmitting infrared light efficiently, such as barium fluoride or calcium is used. Therefore, the airtightness in the space between the substrate 10 and the sputtering stage 7 is maintained, and the space is kept at an appropriate pressure of several Torr.

This opening 30 is provided to pass the light path therethrough to observe with the infrared (radiation) thermometer 5 the radiation of infrared light from the back side of the substrate (an Si wafer in this example) held on the sputtering stage 7-1.

The infrared thermometer 14 is installed in the air. Therefore, the light path 36 must go through a border between atmospheric air and vacuum. Reference numeral 31 indicates an observation window as a partition between atmospheric air and vacuum. The material of a second window plate 23 will be described later, but a material which transmits infrared light efficiently, such as barium fluoride or calcium fluoride is used. Since it is required to withstand the atmospheric pressure, the second window plate 23 is normally given a thickness of about 5 mm to secure strength.

A pipe 32 is used to introduce argon gas into a space defined by the substrate 10 and the sputtering stage. The sputtering stage 7-1 is heated in advance to a specified temperature. A substrate 10 is mounted, and then pushed to the sputtering stage 7-1 by a clamp 17. When argon gas is introduced, heat transmission starts from the sputtering stage 7-1 to the substrate, and the substrate temperature starts to rise quickly.

If the substrate is found to be at a desired temperature, you may start a process such as film deposition, for example, by sputtering a sputtering target 8 located against the substrate 10. If the substrate temperature is too low, it is only necessary to continue to heat the substrate until a specified temperature is reached by adjusting the temperature of the sputtering stage.

The first window plate 24, which is located just below the substrate 10 and directly contacts a gas as a heat transfer medium to be filled in a space defined by the substrate 10 and the sputtering stage 7-1, is heated by a heat transfer gas in the same way that the substrate 10 is heated.

The infrared radiation thermometer 14 "looks" at the substrate through the first and second window plates 24 and 23. To begin with, the first window plate 24 will be described, and the second window plate 23 will be described later. When the first window plate 24 is thick, the intensity of the infrared radiation naturally is reduced. Likewise, if the first window plate 24 is thick and has a great loss by absorption, this means that when the temperature of the first window plate 24 rises, this partition plate itself radiates heat.

Therefore, desirably, the first window plate 24 is as thin as possible. If the first window plate 24 is used to directly separate between the atmospheric air and the space formed by the substrate and the sputtering stage, the first window plate needs to be about 5 mm thick as mentioned above to have the strength to withstand the atmospheric pressure. However, if barium fluoride with a thickness of as much as 5 mm is heated to 400° C., very strong radiation occurs, making it impossible to observe infrared light radiating from the substrate 10. Since a heating method which uses a gas is adopted for the first window plate 24 and the substrate 10, both of them show a tendency to converge to the same temperature. In this respect, too, the first window plate 24 is required to be thin.

Materials which transmit infrared light efficiently are hard to come by. Glass in wide use, quartz glass or the like are not suitable in the least as a material for this window to transmit infrared light. Therefore, the first and second window plates 24 and 23 must both be formed by a material such as barium fluoride.

For the first window plate 24, the normal pressure of Ar gas in sputtering is several mTorr. The pressure in the space formed by the substrate 10 and the sputtering stage is several Torr. Therefore, the pressure applied across the first partition plate 14 is very small, and the partition plate does not require strength to be imparted. This is because the second window plate 23 serves as an interface with the atmospheric pressure.

Hence, the first window plate 24 is sufficient in strength if it has a thickness of 1 mm. In the description of the foregoing embodiments, sufficient explanation has been made about the possiblity that the effect of a radiation light from the first window plate 24 can be reduced by using a thinner plate for the first window plate 24 on the substrate side than the second window plate 23 between the first window plate 24 and the infrared thermometer.

Figure 9:
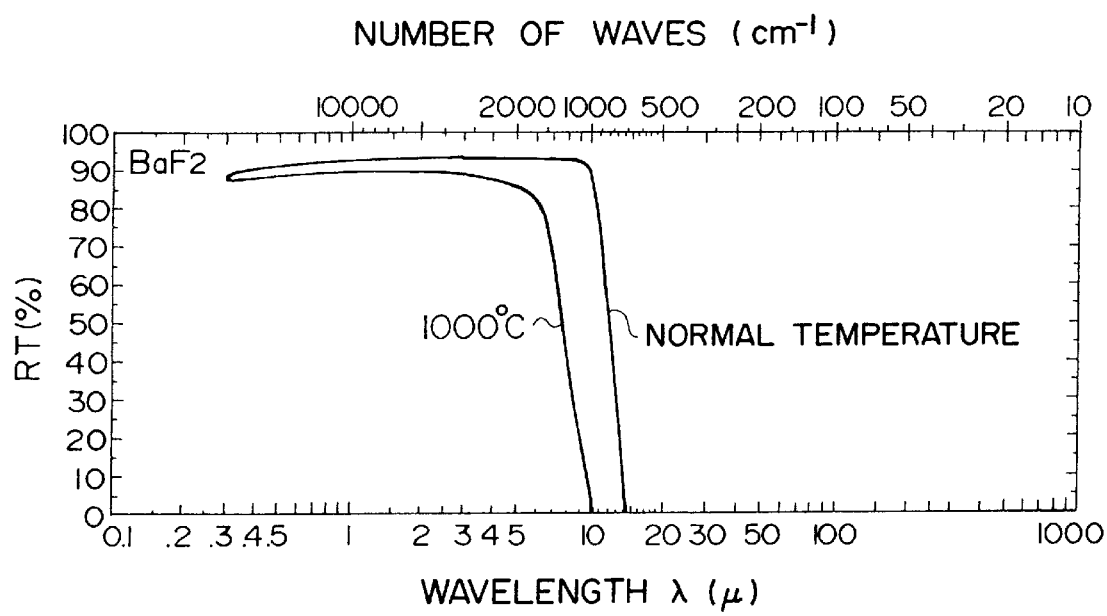
FIG. 9 shows infrared light transmittance of $BaF_2$ (barium fluoride)

FIG. 9 shows the infrared transmittance of barium fluoride. The transmittance at normal temperature and 500° C. is shown. Data was quoted from pp. 491–492 (barium fluoride) and pp. 468–469 (calcium fluoride) of "Kiso Bussei Zuhyo (Fundamental Physical Properties Charts) (Kyoritsu Shuppan: first impression May 15, 1972).

In the deposition of Al by sputtering, the substrate (normally a silicon wafer or the like) is at times heated to about 500° C. at the highest. In FIG. 9, infrared light is transmitted through the substrate at wavelengths of up to 14 µm at normal temperature but no more than 10 µm at 1000° C. Between 10 µm and 14 µm, absorption of infrared light occurs, and from this, it follows that also the radiation of infrared light occurs.

If the second window plate 23 is formed by barium fluoride like the first window plate, when the first window plate 24 rises to 500° C., the radiating infrared light penetrates the second window plate 23 because the second window plate 23 is at normal temperature. This radiating infrared light is observed as if it came from the substrate 10.

Figure 10:
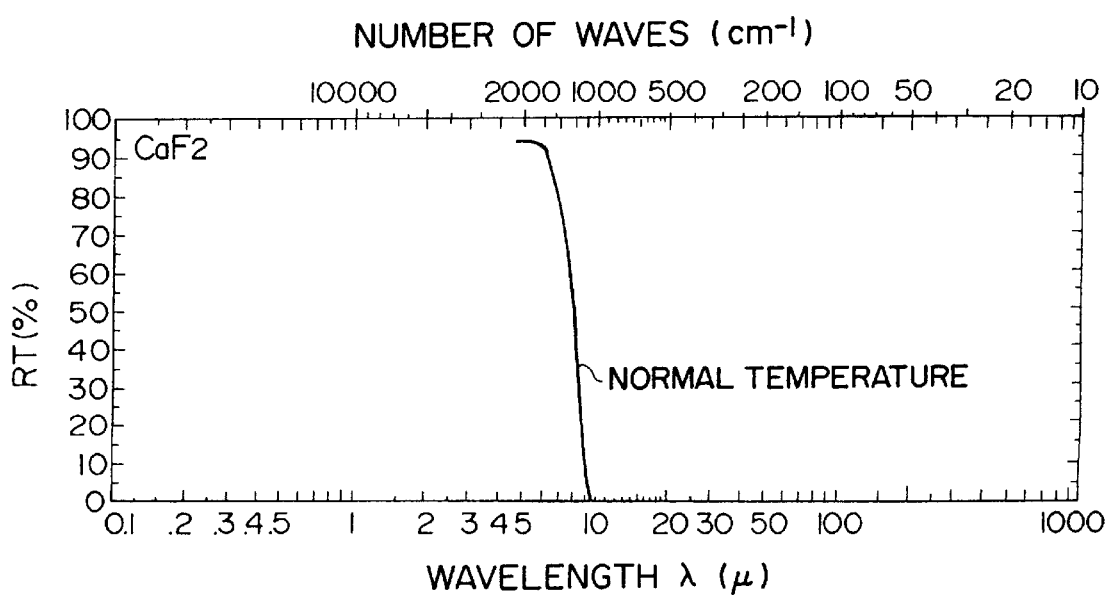
FIG. 10 shows infrared light transmittance of $CaF_2$ (calcium fluoride)

FIG. 10 shows the infrared transmittance of calcium fluoride at normal temperature. From FIG. 10, it will be seen that the transmittance extends on the long wavelength side less than that of barium fluoride at normal temperature shown in FIG. 9. When this calcium fluoride is used for the second window plate 23, even if the first window plate 24 is heated and by itself starts to radiate an infrared light, this unnecessary infrared light is not incident on the infrared thermometer 14 behind the second partition plate 24. Therefore, stable measurement of the substrate temperature is possible regardless of the temperature of the first window plate 24.

Embodiment 5

Figure 11:
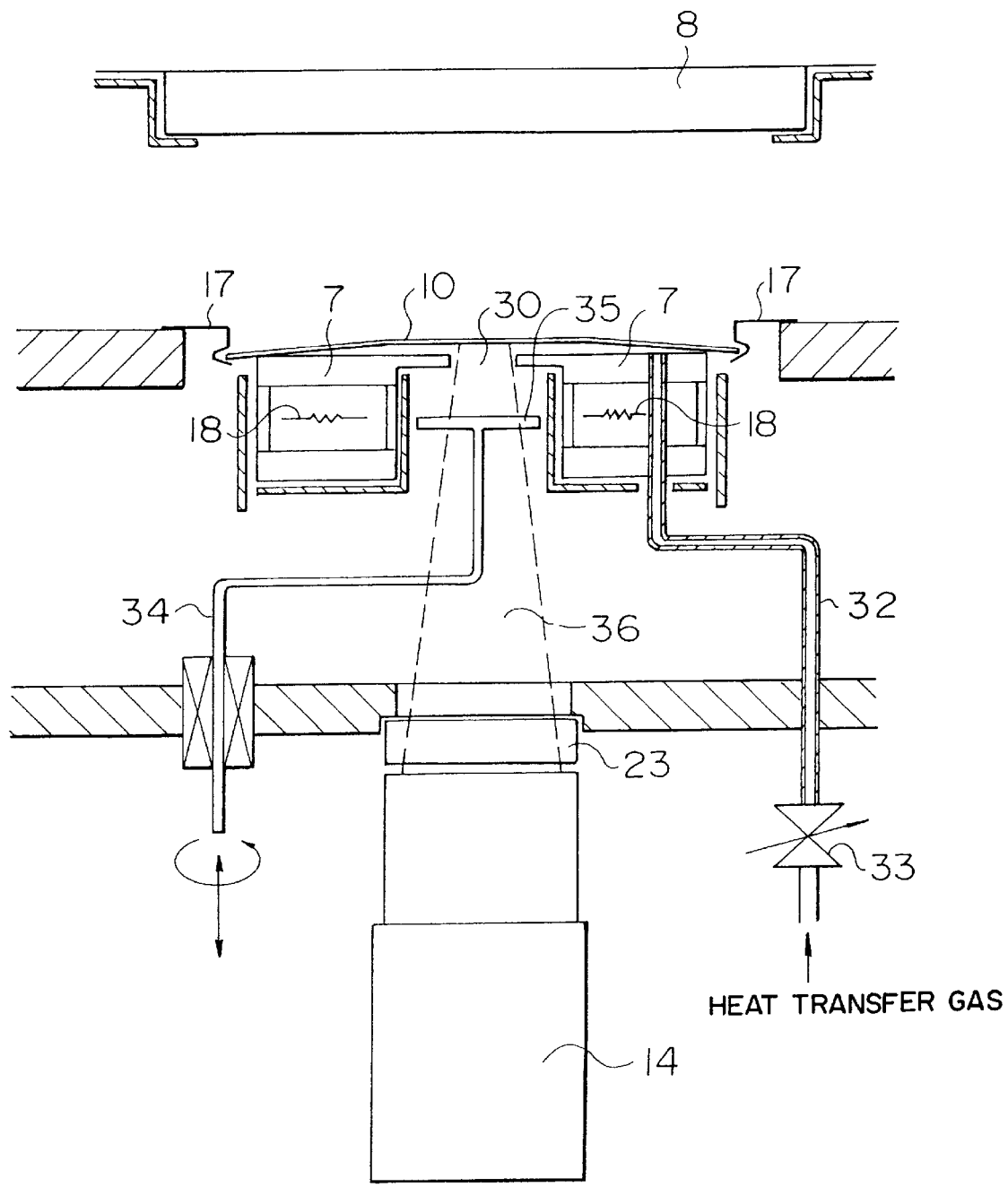
FIG. 11 shows another preferred embodiment of this invention.

In this embodiment, referring to FIG. 11, description will be made of an example in which heating and cooling can be performed with no problem even when there is no window plate in the observation window for measuring the substrate temperature. In this embodiment, a shutter is not used above the substrate. Needless to say, however, the same object can be achieved by using a shutter. Reference numeral 30 indicates an aperture provided in the sputtering stage 7.

Reference numeral 30 indicates an opening provided in the sputtering stage 7. This opening is provided to pass the light path 36 therethrough to observe with the infrared (radiation) thermometer the radiation of infrared light from the back side of the substrate (an Si wafer in this example) held on the sputtering-stage 7-1.

The infrared thermometer 14 is installed in the air. Therefore, the light path 36 must go through the border between the atmospheric air and vacuum. Reference numeral 23 indicates a window for this purpose. For this window, a material transmitting infrared light efficiently, such as barium fluoride or calcium fluoride is used.

A pipe 32 introduces argon gas into a space formed by the substrate and the sputtering stage. The substrate 10 is pushed to the sputtering state by the clamp 17.

The opening 30 of the sputtering stage 7-1 is tightly closed by a cover 35. The cover 35 is supported by a crank-like drive shaft 34, and the drive shaft 34 can move up and down and rotated. FIG. 11 shows the cover lowered to an intermediate position, but the cover can be moved to a much lower position. When the cover is lowered to a position sufficiently below the sputtering stage 7-1, it is pivoted to a position out of the way of the light path for observation by the infrared thermometer.

Also, the drive shaft 34 can rise from the position in FIG. 9, and when it is at top dead center, the opening 30 in the sputtering stage 7-1 can be closed completely from below with the cover 35.

Thus, the air-tightness of the space between the substrate 10 and the sputtering stage 7-1, and the space is kept at an appropriate pressure of about several Torr.

The substrate 10 is secured to the sputtering stage 7-1 with the clamp 17, the peripheral area of the substrate is connected tightly to the peripheral edge of the sputtering stage, and argon gas, for example, is introduced into the space between the surface of the substrate 10 and the sputtering stage 7-1 by adjusting a valve 33.

At this time, the drive shaft 34 has risen to the top dead center, the opening 30 of the sputtering stage 7-1 is closed with the cover 35. Then, heat conduction starts from the sputtering stage 7-1 to the substrate 10, and the substrate temperature rises quickly. After the elapse of some time, the drive shaft 35 is lowered and rotated to move the cover out of the way of the light path 36. Now, the backside of the substrate 10 can be observed by the infrared thermometer 14. As the cover has lowered, the gas pressure of several Torr between the substrate backside and the sputtering stage 7-1 cannot be maintained any more, so that the temperature rise of the substrate substantially stops.

If the substrate is found at a desired temperature, it is possible to start a process such as film deposition, for example, by sputtering a sputtering target 8 located against the substrate 10. If the substrate temperature is too low, it is only necessary to continue to heat the substrate by using the cover 35 and filling the space with a gas.

Embodiment 6

Figure 12:
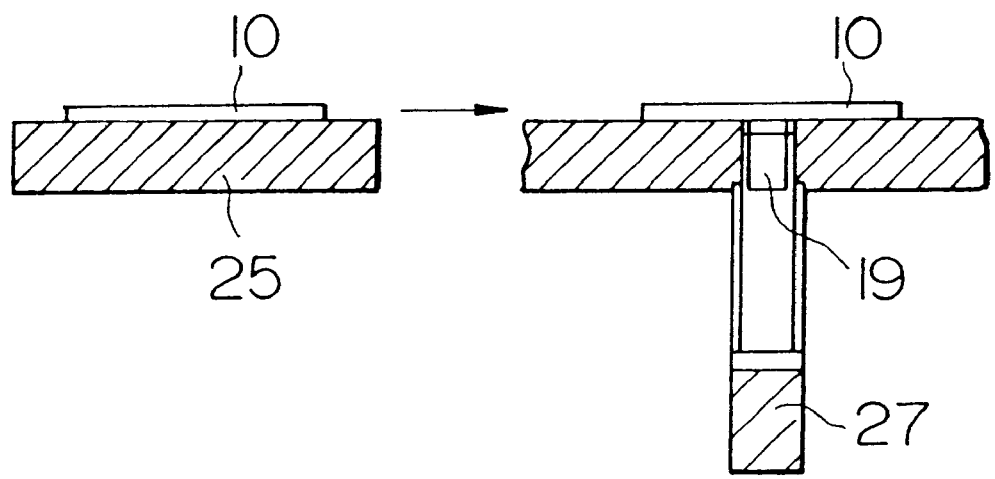
FIG. 12 is a cross-sectional view of the stage as another embodiment of this invention in which the stage is bisected in a chamber.

When the substrate temperature distribution is nonuniform owing to an aperture 19 for substrate infrared temperature measurement provided in the heating or cooling stage, the substrate temperature can be measured in a more uniform temperature distribution by the following arrangement. A stage 25 dedicated to heating or cooling of the substrate is provided separately from the through-hole (aperture) 19 as shown in FIG. 12. The substrate 10 is heated or cooled by the stage 25 and transferred to the stage having the aperture 19, and the substrate temperature in a much uniform temperature distribution can be measured by the infrared radiation thermometer 27.

Embodiment 7

Figure 13:
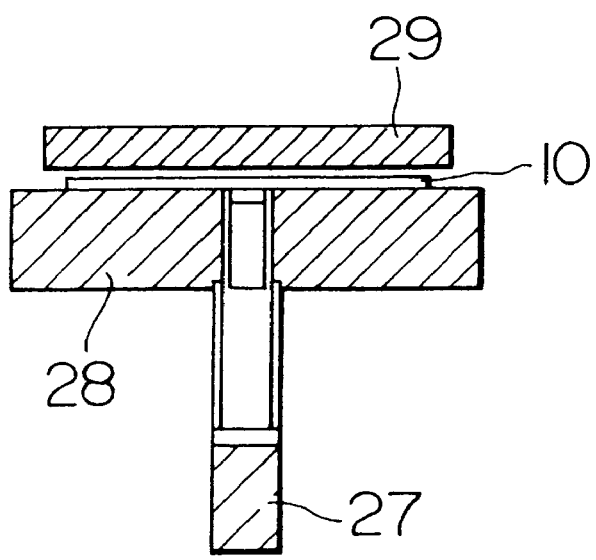
FIG. 13 is a cross-sectional view of the stage having temperature control means provided on both side of the substrate.

When the substrate is heated or cooled either only from the top side or back side thereof, a temperature difference occurs between the top side and the back side of the substrate. However, if heating or cooling means 28 and 29 are provided both on the top and back sides of the substrate as shown in FIG. 13 to control the substrate temperature from both sides, the temperature difference between the two sides can be reduced. By this arrangement, the nonuniformity in the substrate temperature distribution due to the presence of the aperture 19 can also be decreased.

Embodiment 8

Another embodiment will be described in which by using the sputter-deposition apparatus 1 of FIG. 4, an aluminum film is deposited by sputtering on a silicon wafer substrate 10.

The silicon wafer substrate 10 is heated in the temperature calibration chamber 2 up to 500° C. to remove the adsorbed water vapor or the like and the substrate temperature is measured with the thermocouple 12. Based on data of this measurement, the emissivity of the infrared radiation thermometer 11 is calibrated. Then, the wafer is transferred to the substrate temperature adjusting chamber 3.

Figure 14:
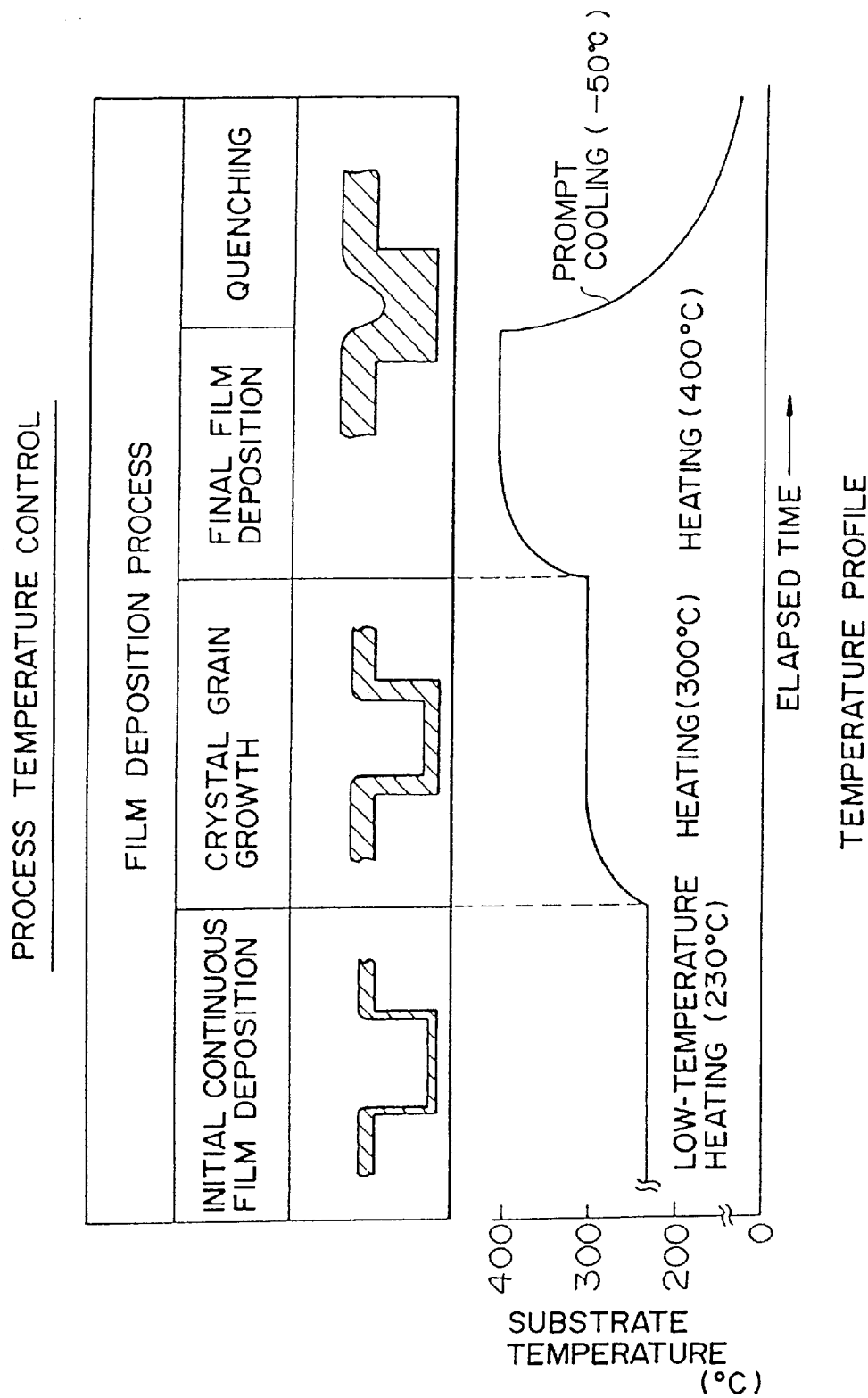
FIG. 14 is an explanatory diagram showing a temperature profile during film deposition.

This emissivity calibration can be done not be this method but by obtaining the transmittance and the reflectance by irradiating the wafer with a light of measuring wavelengths. The wafer substrate 10 transferred to the substrate temperature adjusting chamber 3 is subjected to temperature measurement with the infrared radiation thermometer 14, cooled to a specified temperature of 200° C. by temperature control of the stage 6, and transferred to the sputtering chamber 4. In the sputter-deposition chamber 4, the substrate 10 is subjected to a film deposition process by sputtering in a temperature profile shown in FIG. 14. The target 8 actually used is aluminum containing 1% Si and 3% Cu. To begin with, the temperature of the substrate is controlled at 230° C., the aluminum film is deposited to a thickness of about several hundreds of Å by the first sputter-deposition. Then, sputtering is stopped once, and the substrate is transferred to the substrate temperature adjusting chamber 3. In the substrate temperature adjusting chamber 3, the substrate temperature is raised and controlled at 300° C. to increase the grain size of the crystal grains of the Al film deposited by the first sputter-deposition. Next, the substrate is transferred again to the sputter-deposition chamber 4 where the substrate temperature is set at about 400° C. Then, the second sputter-deposition process is started to increase the film thickness of about 1 μm. Thus, the Al-sputtered film with large grain size and good orientation can be obtained. After the sputtering process is finished, the substrate is immediately sent to the substrate temperature adjusting chamber 3 where the substrate is quenched to about 50° C. In this manner, the precipitation of Si and Cu in the Al-sputtered film could be suppressed.

In the above-mentioned embodiment, a case has been shown in which a silicon wafer is used and a thin film of Å is deposited on the wafer surface. Because in this embodiment the substrate temperature is controlled with high precision by the use of the stage, a good crystallinity and a fine structure of a thin film with excellent reproducibility could be obtained in the wafer. For example, in heating a thin film of several hundreds of A, when the heating temperature was higher than 350° C., the crystallinity did not improve. Therefore, without this invention which enables an accurate temperature to be known, it is impossible to realize such a film deposition method as an industrial process.

It goes without saying that the vacuum processing apparatus according to this invention can be applied to a CVD (Chemical Vapor Deposition) film deposition apparatus or the like in addition to a sputter-deposition apparatus mentioned above.

For example, this invention is effective in depositing a tungsten film on a silicon wafer substrate by a known CVD method.

In any of film deposition apparatuses of this kind, the quality of a deposited film is governed by the accuracy of substrate temperature control. Therefore, the film deposition apparatus according to this invention will sufficiently meet this requirement.

As described in the above-mentioned embodiments, a film deposition apparatus can be realized by using the vacuum processing chamber as the film deposition process chamber. Besides the film deposition chamber, this vacuum processing chamber can be used as a dry etching process chamber. This invention can be applied to temperature control of the substrate to be etched in the same manner as in the above-mentioned embodiments.

As has been described, according to this invention which enables accurate temperature control of the substrate in a vacuum, a vacuum processing apparatus capable of accurate temperature control of the substrate can be realized. If this vacuum processing apparatus is applied to a film deposition apparatus, temperature control can be performed easily in the stages before, after and during the film deposition process, so that a high-quality film deposition can be achieved.

What is claimed is:

1. A substrate temperature control method comprising the steps of:

positioning a substrate which undergoes a heating or cooling process with respect to an infrared radiation thermometer for measuring a temperature of the substrate, positioning a member having a surface providing reflectance at measuring wavelengths on a side of the substrate which is opposite a side facing the infrared radiation thermometer, and effecting heating or cooling of the substrate.

2. A substrate temperature control method according to claim 1, wherein the heating or cooling controls the substrate to a temperature based upon measured values from the infrared radiation thermometer.

3. A substrate temperature control method according to claims 1 or 2, further comprising the step of positioning the reflective surface of the member to the optical axis of the infrared radiation thermometer on the opposite side of the substrate.

4. A substrate temperature control method according to claims 1 or 2, further comprising the steps of setting a second heating condition for the substrate so to effect at least first and second heating, and after the first heating, measuring the substrate temperature using the member and the infrared radiation thermometer, from the result of which the second heating condition is set for the substrate to be heated to a final target heating temperature obtained by the second heating.

5. A substrate temperature measuring method according to claims 1 or 2, wherein a body with substantially no reflectance at measuring wavelengths, is positioned at a place where the member is located.

* * * * *